US012431328B2

(12) United States Patent
Konyuba

(10) Patent No.: US 12,431,328 B2
(45) Date of Patent: Sep. 30, 2025

(54) ELECTRON MICROSCOPE AND CALIBRATION METHOD

(71) Applicant: JEOL Ltd., Tokyo (JP)

(72) Inventor: Yuji Konyuba, Tokyo (JP)

(73) Assignee: JEOL Ltd., Tokyo (JP)

( * ) Notice: Subject to any disclaimer, the term of this patent is extended or adjusted under 35 U.S.C. 154(b) by 375 days.

(21) Appl. No.: 18/199,728

(22) Filed: May 19, 2023

(65) Prior Publication Data

US 2023/0386782 A1 Nov. 30, 2023

(30) Foreign Application Priority Data

May 25, 2022 (JP) ................................ 2022-085240

(51) Int. Cl.
*H01J 37/28* (2006.01)
*G06T 5/50* (2006.01)
*G06V 10/28* (2022.01)

(52) U.S. Cl.
CPC ............... *H01J 37/28* (2013.01); *G06T 5/50* (2013.01); *G06V 10/28* (2022.01); *G06T 2207/10061* (2013.01); *G06T 2207/20221* (2013.01)

(58) Field of Classification Search
CPC .. H01J 37/00; H01J 37/02; H01J 37/26; H01J 37/28; H01J 37/222; H01J 2237/20221; H01J 2237/2802; H01J 2237/2826; G06T 5/50; G06T 2207/10061; G06T 2207/20221; G06V 10/28

USPC .......................................... 250/306, 307, 311
See application file for complete search history.

(56) References Cited

U.S. PATENT DOCUMENTS

| | | | |
|---|---|---|---|
| 2013/0228683 A1* | 9/2013 | Boughorbel | G01N 23/225 250/306 |
| 2015/0332892 A1* | 11/2015 | Mooney | H01J 37/26 250/307 |
| 2018/0068199 A1* | 3/2018 | Itoh | G06T 7/11 |
| 2020/0014869 A1 | 1/2020 | Waugh et al. | |
| 2021/0293979 A1 | 9/2021 | Waugh et al. | |

FOREIGN PATENT DOCUMENTS

JP 2020512632 A 4/2020

* cited by examiner

*Primary Examiner* — Jason L McCormack
(74) *Attorney, Agent, or Firm* — The Webb Law Firm

(57) ABSTRACT

An electron microscope includes an electronic optical system that irradiates a specimen with an electron beam and forms an image; a camera that includes an image sensor and outputs a frame image; and a computation unit that generates an image based on the frame image. The computation unit sets a threshold; and binarizes the frame image using the threshold, and generates the image based on the binarized frame image. In setting the threshold, the computation unit repeatedly sets a tentative threshold, acquires a plurality of the frame images obtained on a condition that electrons entering the image sensor follow Poisson process, binarizes each of the plurality of acquired frame images using the tentative threshold, generates an integrated image by integrating the plurality of binarized frame images, and obtains a normalized constant based on a mean and variance of pixel values of pixels of the integrated image.

5 Claims, 11 Drawing Sheets

ELECTRON MICROSCOPE AND CALIBRATION METHOD

CROSS-REFERENCE TO RELATED APPLICATION

This application claims priority to Japanese Patent Application No. 2022-085240, filed May 25, 2022, the disclosure of which is hereby incorporated by reference in its entirety.

BACKGROUND OF THE INVENTION

Field of the Invention

The present invention relates to an electron microscope and a calibration method.

Description of Related Art

Transmission electron microscopes detect electrons transmitted through a specimen by using a camera.

For example, in an apparatus disclosed in JP-A-2020-512632, electrons are detected two-dimensionally by using a multichannel plate, a fluorescent plate for generating light, and a camera for recording light. In an apparatus disclosed in JP-A-2020-512632, events are detected by performing a pixel-by-check on a frame from the camera, and the events are tagged, and moreover the tagged events are combined, thereby generating a two-dimensional image.

Images obtained for respective frames by detecting events form a map indicating where the events occurred, in other words, where the electrons entered. Specifically, in each frame after an event was detected, a pixel value of "1" signifies an event indicating an incident electron, and a pixel value of "0" signifies that no event has occurred. For this reason, the pixel value of each of the pixels of the two-dimensional image generated by combining the events respectively corresponds to the number of events that occurred in the pixel for a time period in which all the combined frames are imaged, that is, the number of incident electrons. In this manner, in the apparatus disclosed in JP-A-2020-512632, a two-dimensional image is generated by performing counting processing, in which a frame is binarized and the number of electrons are counted.

In the apparatus disclosed in JP-A-2020-512632, electrons are detected at a high frame rate, and counting processing is performed on each frame, thereby reducing influence exerted due to the fluorescent plate having a non-linear gain profile with respect to the strength, and making it possible to acquire the images with a favorable linearity.

When performing counting processing for binarizing a frame and counting incident electrons, if an appropriate threshold is not set, noise may be counted as incident electrons, or even incident electrons may fail to be counted, i.e., count loss may occur.

SUMMARY OF THE INVENTION

According to a first aspect of the present disclosure, there is provided an electron microscope including:
an electronic optical system that irradiates a specimen with an electron beam and forms an image using electrons transmitted through the specimen;
a camera that includes an image sensor and outputs a frame image which is based on a signal obtained by electrons entering each cell of the image sensor; and
a computation unit that generates an image based on the frame image,
the computation unit performing processing for:
setting a threshold; and
binarizing the frame image using the threshold, and generating the image based on the binarized frame image, and
in the processing for setting the threshold,
the computation unit repeatedly performing processing for (i) setting a tentative threshold, (ii) acquiring a plurality of the frame images obtained on a condition that electrons entering the image sensor follow Poisson process, (iii) binarizing each of the plurality of acquired frame images using the tentative threshold, (iv) generating an integrated image by integrating the plurality of binarized frame images, and (v) obtaining a normalized constant based on a mean and variance of pixel values of pixels of the integrated image, with the tentative threshold being differed each time of the processing, and
the computation unit obtaining an optimal threshold based on the plurality of obtained normalized constants and setting the optimal threshold as the threshold.

According to a second aspect of the present disclosure, there is provided a calibration method for threshold calibration performed by an electron microscope,
the electron microscope including:
an electronic optical system that irradiates a specimen with an electron beam and forms an image using electrons transmitted through the specimen;
a camera that includes an image sensor and outputs a frame image which is based on a signal obtained by electrons entering each cell of the image sensor; and
a computation unit that generates an image based on the frame image,
the computation unit performing processing for binarizing the frame image using a threshold, and generating the image based on the binarized frame image,
the calibration method comprising:
repeatedly performing processing for (i) setting a tentative threshold, (ii) acquiring a plurality of the frame images obtained on a condition that electrons entering the image sensor follow Poisson process, (iii) binarizing each of the plurality of acquired frame images using the tentative threshold, (iv) generating an integrated image by integrating the plurality of binarized frame images, and (v) obtaining a normalized constant based on a mean and variance of pixel values of pixels of the integrated image, with the tentative threshold being differed each time of the processing;
obtaining an optimal threshold based on the plurality of obtained normalized constants; and
setting the optimal threshold as the threshold.

DESCRIPTION OF THE INVENTION

Figure 1:
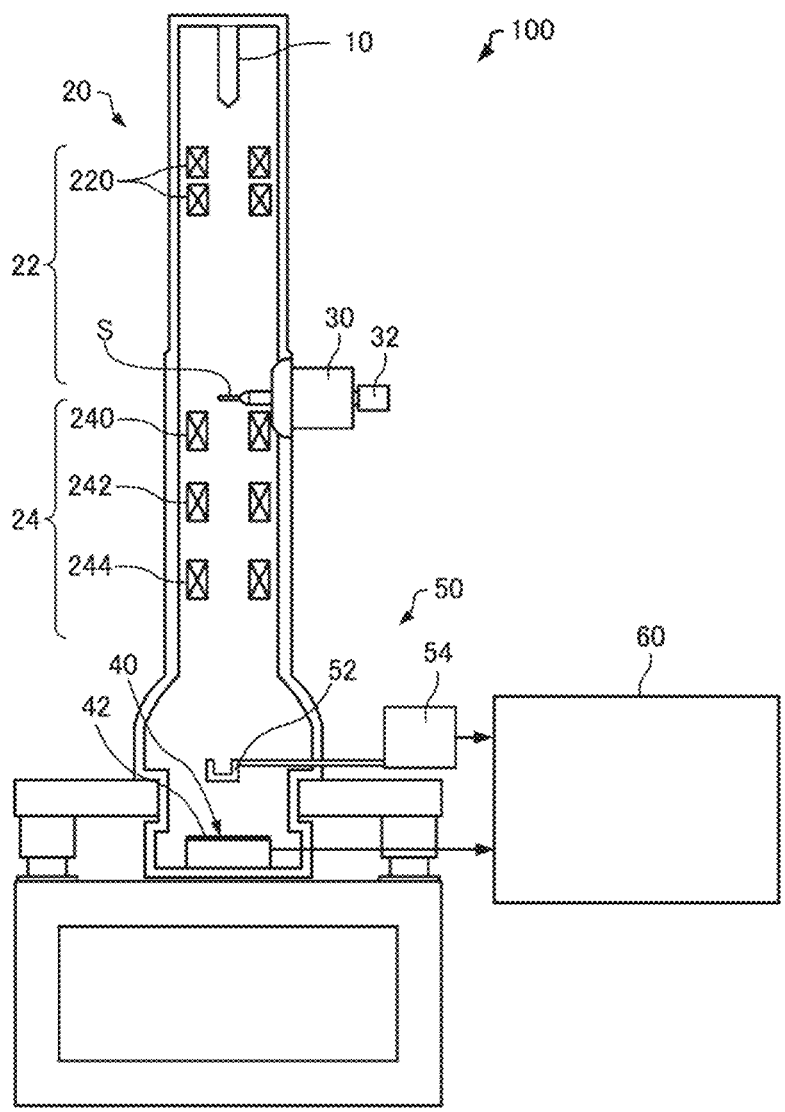
FIG. 1 is a diagram illustrating a configuration of an electron microscope according to an embodiment of the invention.

According to an embodiment of the present disclosure, there is provided an electron microscope including:
an electronic optical system that irradiates a specimen with an electron beam and forms an image using electrons transmitted through the specimen;
a camera that includes an image sensor and outputs a frame image which is based on a signal obtained by electrons entering each cell of the image sensor; and
a computation unit that generates an image based on the frame image,
the computation unit performs processing for:
setting a threshold; and
binarizing the frame image using the threshold, and generating the image based on the binarized frame image, and
in the processing for setting the threshold,
the computation unit repeatedly performing processing for (i) setting a tentative threshold, (ii) acquiring a plurality of the frame images obtained on a condition that electrons entering the image sensor follow Poisson process, (iii) binarizing each of the plurality of acquired frame images using the tentative threshold, (iv) generating an integrated image by integrating the plurality of binarized frame images, and (v) obtaining a normalized constant based on a mean and variance of pixel values of pixels of the integrated image, with the tentative threshold being differed each time of the processing, and
the computation unit obtaining an optimal threshold based on the plurality of obtained normalized constants and setting the optimal threshold as the threshold.

With this electron microscope, the threshold of binarization can be appropriately set.

According to an embodiment of the present disclosure, there is provided a calibration method for threshold calibration performed by an electron microscope,
the electron microscope including:
an electronic optical system that irradiates a specimen with an electron beam and forms an image using electrons transmitted through the specimen;
a camera that includes an image sensor and outputs a frame image which is based on a signal obtained by electrons entering each cell of the image sensor; and
a computation unit that generates an image based on the frame image,
the computation unit performing processing for binarizing the frame image using a threshold, and generating the image based on the binarized frame image,
the calibration method comprising:
repeatedly performing processing for (i) setting a tentative threshold, (ii) acquiring a plurality of the frame images obtained on a condition that electrons entering the image sensor follow Poisson process, (iii) binarizing each of the plurality of acquired frame images using the tentative threshold, (iv) generating an integrated image by integrating the plurality of binarized frame images, and (v) obtaining a normalized constant based on a mean and variance of pixel values of pixels of the integrated image, with the tentative threshold being differed each time of the processing;
obtaining an optimal threshold based on the plurality of obtained normalized constants; and
setting the optimal threshold as the threshold.

With this calibration method, the threshold of binarization can be appropriately set.

Preferred embodiments of the invention will now be described in detail with reference to the drawings. It is noted that the embodiments described below do not unduly limit the scope of the invention as stated in the claims. Further, all of the components described in the following embodiments are not necessarily essential requirements of the invention.

1. Electron Microscope

First, an electron microscope according to an embodiment of the invention will be described with reference to the drawings. FIG. 1 is a diagram illustrating a configuration of an electron microscope 100 according to the embodiment of the invention.

The electron microscope 100 includes an electron source 10, an electronic optical system a specimen stage 30, a camera 40, a measurement device 50, and a computation unit 60.

The electron source 10 emits an electron beam. The electron source 10 is, for example, an electron gun that accelerates electrons, emitted from a cathode, by an anode, and emits an electron beam thereby.

The electronic optical system 20 irradiates a specimen S with an electron beam from the electron source 10, and forms an image with the electrons transmitted through the specimen S. The electronic optical system 20 includes an irradiation system 22 and an image forming system 24.

The irradiation system 22 irradiates the specimen S with an electron beam emitted from the electron source 10. For example, the irradiation system 22 irradiates the specimen S with a parallel beam. The irradiation system 22 includes a plurality of condenser lenses 220. The condenser lenses 220 focus the electron beam emitted from the electron source 10.

Although not illustrated, the irradiation system 22 may also include lenses other than the condenser lenses 220, an aperture, and the like.

The image forming system 24 is an optical system for forming an image with an electron beam transmitted through the specimen S. The image forming system 24 includes an objective lens 240, an intermediate lens 242, and a projector lens 244.

The objective lens 240 is a lens at the initial stage, for forming a TEM image using an electron beam transmitted through the specimen S. An electronic diffraction pattern is formed on a back focal plane of the objective lens 240. The intermediate lens 242 changes the focal length to focus on the TEM image or the electronic diffraction pattern formed through the objective lens 240, enlarges the TEM image or the electronic diffraction pattern, and forms the TEM image or the electronic diffraction pattern on an object plane of the projector lens 244. The projector lens 244 enlarges the image (the TEM image or the electronic diffraction pattern) formed through the intermediate lens 242, and forms the image on an image sensor 42 of the camera 40.

Although not illustrated, the image forming system 24 may include lenses other than the objective lens 240, the intermediate lens 242, and the projector lens 244, an aperture, and the like.

The specimen stage 30 supports the specimen S held by a specimen holder 32. The specimen S can be positioned using the specimen stage 30.

The camera 40 includes the image sensor 42. The camera 40 is a direct electron detector for directly detecting electrons with the image sensor 42. In other words, the camera 40 is not an indirect electron detector that converts electrons into light using a scintillator and images the light with a camera to detect the electrons, but the camera 40 directly detects the electrons with the image sensor 42 without using a scintillator. For this reason, with the camera 40, in a process for converting the electrons into light, a blur due to the light spreading can be reduced, and an image with a high resolution can be acquired.

Examples of the direct electron detector include K2 and K3 manufactured by Gatan GmbH, Falcon 4 manufactured by Thermo Fisher Scientific K.K., and DE-64 manufactured by Direct Electron, LP. Since a high contrast can be obtained with a low irradiation amount, the direct electron detector is suitable for a cryo electron microscope and the like.

The image sensor 42 includes a support layer, a sensitive layer, and an electrode layer. The support layer supports the sensitive layer and the electrode layer. When electrons enter the sensitive layer, electron hole pairs are generated due to a photoelectric effect, the electrons (or holes) are converted into voltage, and signals are read out. The wiring layer functions as a wiring for transmitting the signals.

The image sensor 42 includes a plurality of cells. Due to the electrons entering each cell of the image sensor 42, a signal can be obtained for each cell. In the image sensor 42, each cell independently detects the electrons.

The image sensor 42 is a CMOS image sensor, a CCD image sensor, or the like, for example. If a CMOS image sensor is used as the image sensor 42, frame images can be captured at a higher frame rate, compared to a case where a CCD image sensor is used. In other words, by using a CMOS image sensor as the image sensor 42, the number of frame images that can be captured per unit time can be increased.

The camera 40 outputs the frame images based on the signals obtained by the electrons that entered the cells of the image sensor 42. The pixel of each frame image output from the camera 40 respectively correspond to the cells of the image sensor 42. Also, the pixel values of the pixels of the frame images respectively correspond to the generation amount of signals due to the electrons that entered the corresponding cells. Note that the plurality of cells of the image sensor 42 may be considered as a single cell and made correspond to the pixels in the frame image.

The camera 40 captures the TEM image or the electronic diffraction pattern formed on the image sensor 42, and outputs the image as the frame image. Frame is the minimum unit of image-capturing, and a frame image is an image obtained by capturing one frame.

The measurement device 50 measures an amperage of the electrons that enter the image sensor 42. The measurement device 50 includes a Faraday gauge 52 and an ammeter 54. The Faraday gauge 52 is disposed on an optical axis of the electronic optical system 20, and the current is measured with the ammeter 54 connected to the Faraday gauge 52. With this, the amperage of electrons that enter the image sensor 42 can be measured. Note that when a TEM image and the electronic diffraction pattern are captured with the camera 40, the Faraday gauge 52 is retracted from the optical axis.

The computation unit 60 generates an image based on the frame image. The computation unit 60 includes, for example, a processing circuit such as a CPU (Central Processing Unit) and an FPGA (Field Programmable Gate Array), and a storage circuit such as a semiconductor memory. The detail of processing performed by the computation unit 60 will be described later.

2. Processing Performed by Computation Unit 2.1. Image Generation

The computation unit 60 performs counting processing (binarization) on the frame images captured with the camera 40, and integrates the frame images subjected to the counting processing to generate an image. Here, the image is a TEM image, an electronic diffraction pattern, or the like.

In a direct electron detector, when the electrons enter the sensitive layer of the image sensor 42, the electron hole pairs are generated due to the photoelectric effect, and the electrons (or holes) are converted into a voltage and signals are read out.

Figure 2:
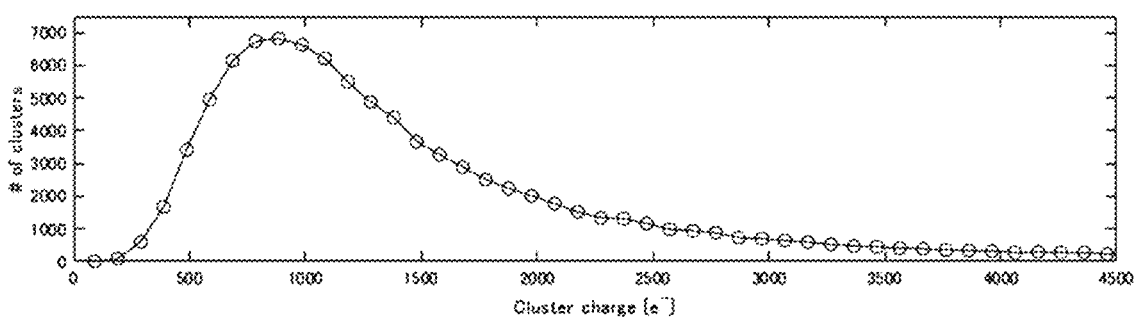
FIG. 2 is a graph illustrating the quantity of signal generation due to incident electrons and the frequency of the generation.

FIG. 2 is a graph illustrating the quantity of signal generation due to the incident electrons and frequency of the generation.

The quantity of signal generation due to the photoelectric effect conforms to a Landau distribution as illustrated in FIG. 2. For this reason, the number of incident electrons cannot be known from the quantity of signal generation. This is because the material for the sensitive layer is silicone with the thickness of as small as several μm, and thus, in many cases, the incident electrons reach the lowest portion of the image sensor without completely losing their energy. Therefore, when an image is generated by simply integrating the frame images, the linearity between the pixel value of each pixel of the frame image (the quantity of signal generation in each cell) and the number of incident electrons is insufficient.

The computation unit 60 performs counting processing in order to improve the linearity. In the counting processing, the frame image is binarized, and the incident electrons are counted.

Figure 3:
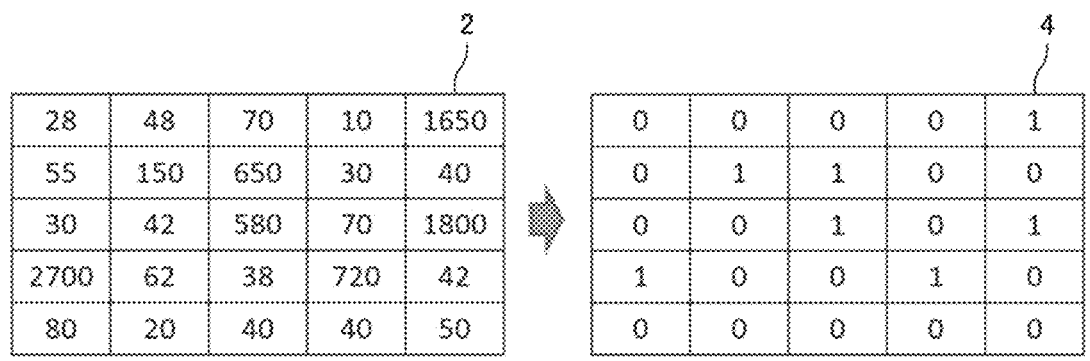
FIG. 3 is a diagram for explaining counting processing.

FIG. 3 is a diagram for explaining the counting processing. FIG. 3 illustrates a frame image 2 output from the camera 40, and a frame image 4 that was subjected to the counting processing. The pixel values of the pixels in the frame image 2 respectively correspond to the quantity of signal generation due to the electrons that entered the cells in the image sensor 42.

Here, when the threshold is set to 140, if the pixel values of the pixels in the frame image 2 are larger than 140, the corresponding pixel values are set to "1", and if the pixel values of the pixels in the frame image 2 are 140 or less, the corresponding pixel values are set to "0". In this manner, the frame image 2 is binarized, and the binarized frame image 4 can be obtained.

Then, the frame images 4 that were subjected to the counting processing in this manner are integrated. Accordingly, an image with the improved linearity between the pixel values and the number of incident electrons can be generated.

2.2. Threshold Calibration Method
2.2.1. Threshold

The computation unit 60 binarizes a frame image.

Even if two or more electrons enter one cell in the image sensor 42 in one frame, which is the image-capturing unit, due to the binarization, it is determined that one electron has entered. And thus, count loss occurs. As a result, the detective quantum efficiency (DQE) decreases. Accordingly, when the counting processing is performed on a frame image, the mean number of the electrons that enter each cell in the image sensor 42 is preferably 0.1 e$^-$/pixel/frame or less, that is, the condition that 0.1 electron or less enter each cell per frame is preferably satisfied.

Note that the detective quantum efficiency is a ratio between (S/N)$^2$ of input signals and (S/N)$^2$ of output (detected) signals. If a detector is ideal, the detective quantum efficiency is 1. Note that S/N refers to an SN ratio (signal-to-noise ratio).

Figure 4:
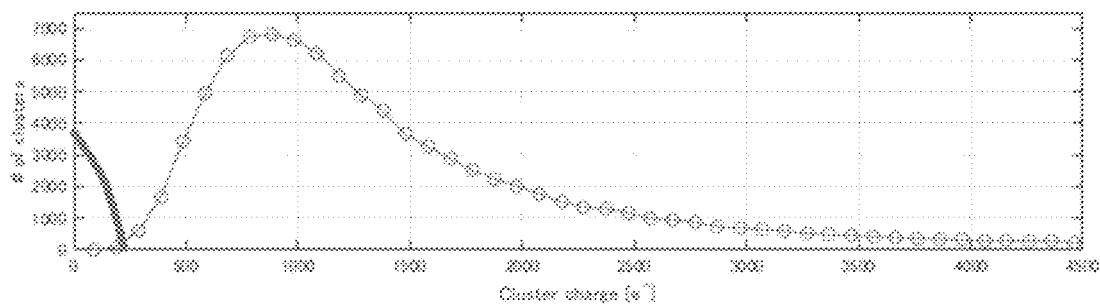
FIG. 4 is a graph illustrating the quantity of signal generation due to incident electrons and the frequency of the generation, with noise added.

FIG. 4 is a graph in which noise of the cells is added to the graph illustrating the quantity of signal generation due to incident electrons and the frequency of generation illustrated in FIG. 2.

As illustrated in FIG. 4, when the electrons are detected with the image sensor, noise (random noise) is superposed on the Landau distribution illustrated in FIG. 2. At this time, if the threshold is set to a value larger than the noise, the noise is not counted as a signal. Also, in order to reduce count loss of the incident electrons, the threshold may be set to a small value within a range in which the noise is not included.

In this manner, in the counting processing, if the threshold of binarization is not appropriately set, noise may be counted as incident electrons, or the incident electrons may fail to be counted (i.e., count loss may occur).

Also, in the direct electron detector, the transistor and the like included in the image sensor 42 are damaged due to the electrons. The accumulation of such damages due to the electrons incurs an increases of noise and a decrease in the quantity of generated signals, and the image sensor 42 is degraded. If the image sensor 42 is degraded, profiles of the noise and signals illustrated in FIG. 4 change. Accordingly, when performing counting processing, it is necessary to newly find the optimal threshold. As such, in the electron microscope 100, calibration of the threshold need be performed.

2.2.2. Precondition

First, before the computation unit 60 performs calibration of the threshold, the electronic optical system 20 is adjusted such that the electrons entering the image sensor 42 follow a Poisson process. Specifically, the electronic optical system 20 is adjusted such that the mean and variance of number of the electrons that enter each cell in the image sensor 42 per frame match each other. For example, by emitting the electron beam on a vacuum portion instead of the specimen S, the electronic optical system 20 is adjusted such that a parallel irradiation condition in which the electron beam is uniformly emitted on the image sensor 42 is satisfied.

Also, the mean number of electrons that enter each cell in the image sensor 42 per frame is set smaller than one. The mean number of electrons that enter each cell in the image sensor 42 per frame is obtained by dividing the number of electrons that enter the image sensor 42 per frame by the number of cells included in the image sensor 42. The mean number of electrons that enter each cell in the image sensor 42 per frame is preferably 0.1 or less, that is, 0.1 e$^-$/pixel/frame. By adjusting the electronic optical system 20, the number of electrons that enter each cell of the image sensor 42 per frame can be adjusted.

Also, as a precondition, it is assumed that the electrons that entered one cell in the image sensor 42 do not enter other cells.

In order to calculate the optimal threshold, it is necessary for the input to the image sensor 42 and the output after counting processing to follow the Poisson process.

2.2.3. Processing Flow

Figure 5:
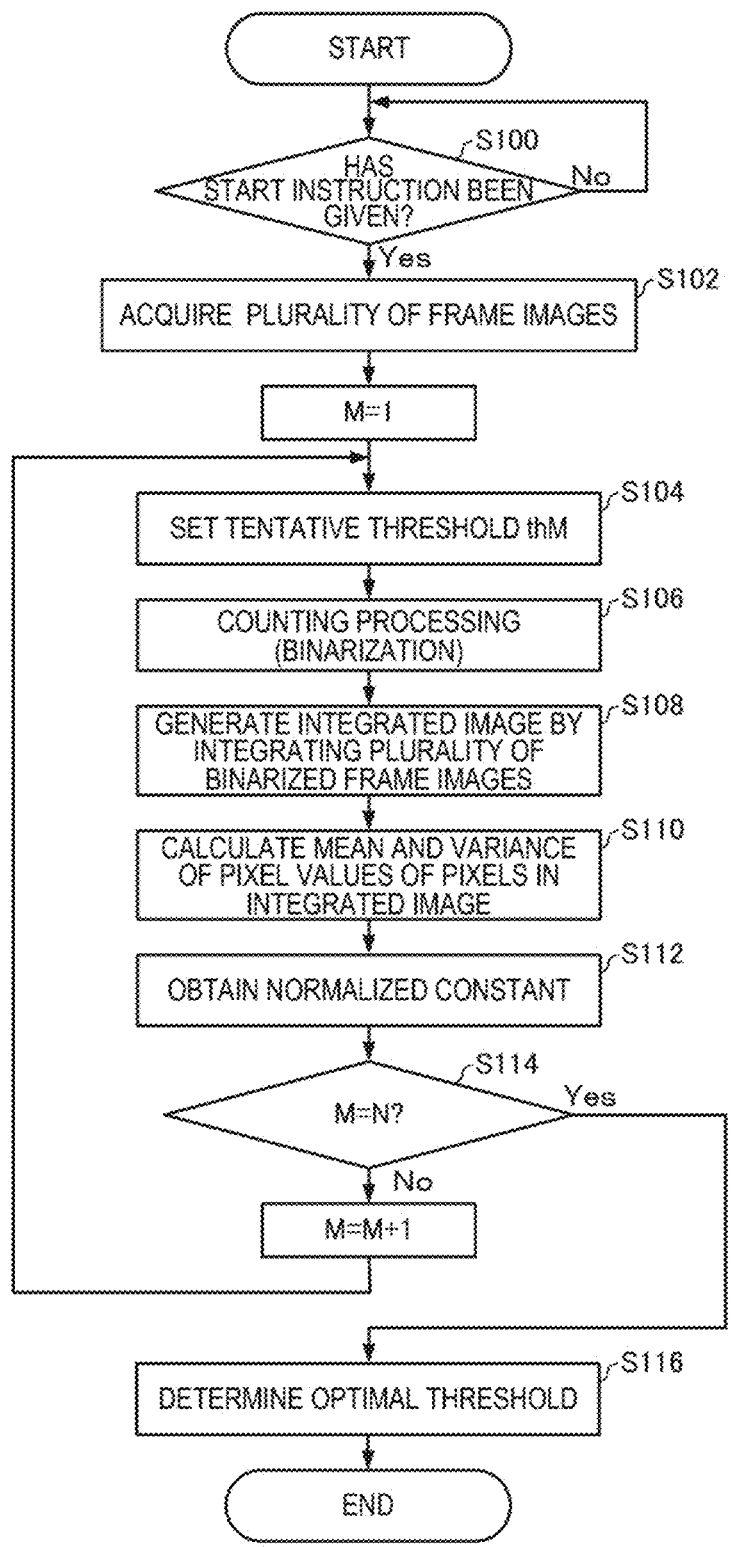
FIG. 5 is a flowchart illustrating an example of processing for setting a threshold value, performed by a computation unit.

FIG. 5 is a flowchart illustrating an example of processing for setting a threshold value performed by the computation unit 60.

The computation unit 60 determines whether a user has performed an instruction to start calibration of the threshold (S100). For example, when an operation for pressing a calibration start button is performed, or when a calibration start instruction is input from the GUI or an input device, the computation unit 60 determines that the user has performed the start instruction.

If it is determined that the start instruction has been performed (Yes in S100), the computation unit 60 acquires a plurality of frame images (S102).

The computation unit 60 acquires a predetermined number of frame images. The greater the number of frame images is, the smaller the statistical fluctuation can be. The number of frame images to be acquired is, for example, about from several dozen or more to several hundred or less.

The frame images are captured on the above precondition. That is, the frame images are captured on the condition that the electrons that enters the image sensor 42 follow the Poisson process, and the mean number of electrons that enter each cell in the image sensor 42 per frame is less than 1.

Before performing the start instruction, the user adjusts the electronic optical system 20 in advance such that the above precondition is satisfied. The computation unit 60 causes the camera 40 to capture a predetermined number of frame images. In this manner, the computation unit 60 can acquire the plurality of frame images obtained on the condition that the electrons that enter the image sensor 42 follow the Poisson process.

Next, the computation unit 60 sets a tentative threshold (tentative threshold thM) of binarization in counting processing (S104). Here, it is assumed that M=1, and th1 is set as the tentative threshold.

The computation unit 60 performs counting processing on the acquired plurality of frame images (S106). The computation unit 60 binarizes the frame images using the tentative threshold th1. Specifically, if the pixel values of the pixels of the frame images are larger than the tentative threshold th1, the computation unit 60 sets the corresponding pixel values to "1", and if the pixel values of the pixels are the tentative threshold th1 or less, the computation unit 60 sets the corresponding pixel values to "0". In this manner, the frame images are binarized, thereby generating binarized images.

Next, the computation unit 60 generates an integrated image by integrating the plurality of binarized frame images (S108). The computation unit 60 integrates the pixel values of the corresponding pixels in the plurality of binarized frame images to generate the integrated image.

Next, the computation unit 60 calculates the mean and variance of the pixel values of the pixels of the integrated image (S110). The computation unit 60 obtains a normalized constant S based on the calculated mean and variance (S112). The computation unit 60 obtains the normalized constant S by dividing the calculated mean by the calculated variance.

Next, the computation unit 60 determines whether M=N is satisfied (S114). In other words, the computation unit 60 determines whether the tentative threshold thN has been set.

If the computation unit 60 determines that M=N is not satisfied (No in S114), the computation unit 60 sets M=M+1, and returns to processing S104 to set a tentative threshold th2 (S104). The tentative threshold th2 has a different value from the tentative threshold th1.

The computation unit 60 performs the counting processing on each of the plurality of acquired frame images (S106). The computation unit 60 binarizes the frame images using the tentative threshold th2. The computation unit 60 generates the integrated image by integrating the plurality of binarized frame images (S108), calculates the mean and variance of the pixel values of the pixels of the integrated image (S110), and obtains the normalized constant S based on the calculated mean and variance (S112).

In this manner, with a different tentative threshold each time, the computation unit 60 repeats processing S104, S106, S108, S110, S112, and S114. The computation unit 60 repeats the processing N times, and when M=N is satisfied (Yes in S114), determines the optimal threshold based on the obtained N normalized constants S (S116).

The computation unit 60 sets the minimum tentative threshold, of the tentative thresholds for which the normalized constants S satisfying $1-0.07 \leq S \leq 1+0.07$ can be obtained, as the optimal threshold, for example. The determination criteria of $1-0.07 \leq S \leq 1+0.07$ is determined based on the number of electrons that enter each cell of the image sensor 42 per unit time (e$^-$/pixel/sec), the size of the data (pixel count) included in the frame image, the bit depth (the quantity of data assigned per pixel), the quantity of signal generation (Landau distribution with noise added), the number of frame images on which the counting processing is performed, and the like. Also, by setting the minimum tentative threshold of the tentative thresholds that satisfy this range to the optimal threshold, count loss of electrons can be reduced.

Note that the determination method of the optimal threshold is not limited thereto, and for example, the tentative threshold for which the normalized constant S closest to "1" was obtained may be set as the optimal threshold.

The computation unit 60 sets the tentative threshold that was set as the optimal threshold as the threshold used in the processing for generating images, and ends the processing.

2.3. Calculation of Detective Quantum Efficiency

Figure 6:
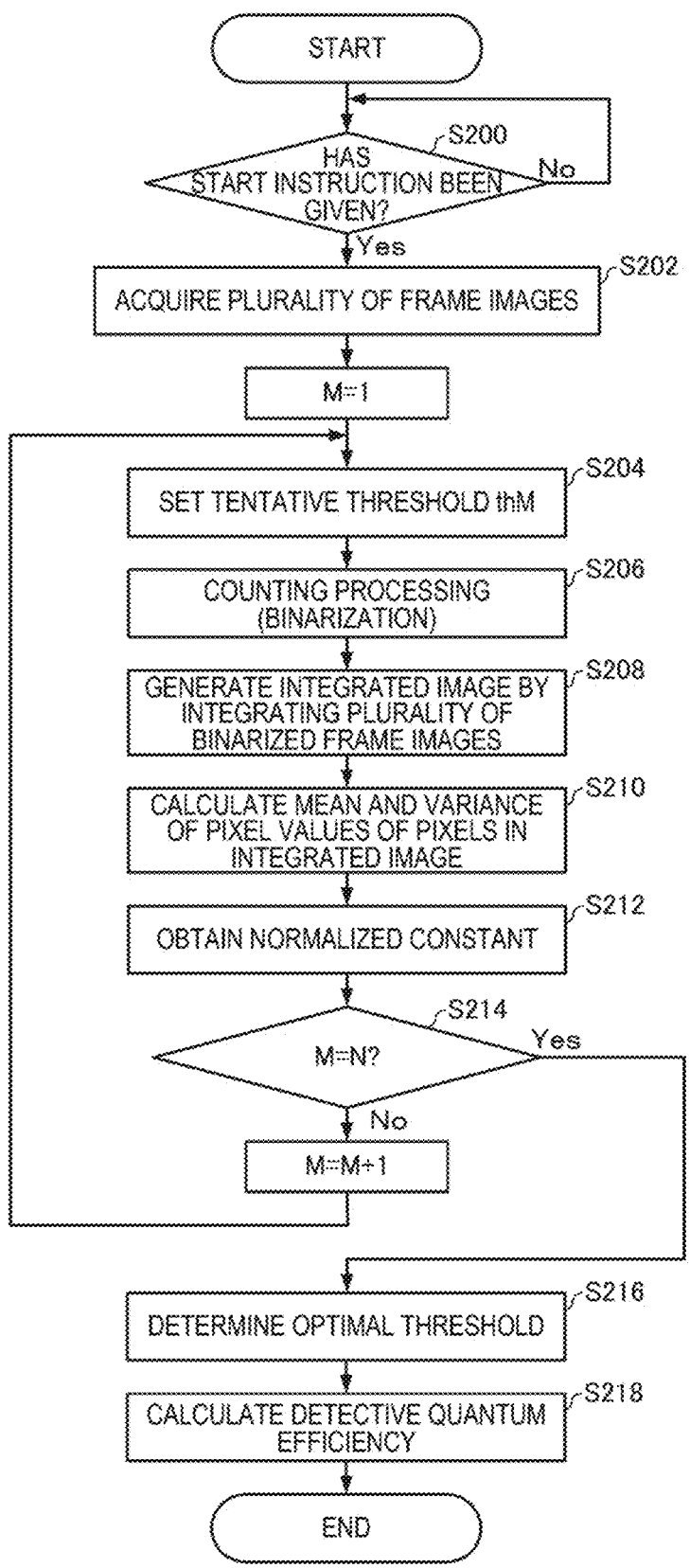
FIG. 6 is a flowchart illustrating an example of processing for calculating a detective quantum efficiency, performed by the computation unit.

The computation unit 60 can calculate a detective quantum efficiency (DQE). FIG. 6 is a flowchart illustrating an example of processing for calculating the detective quantum efficiency performed by the computation unit 60.

The precondition for obtaining the detective quantum efficiency is the same as the precondition for performing calibration of the threshold.

The computation unit 60 determines whether the user has performed an instruction for starting processing for calculating the detective quantum efficiency (S200). When a calculation processing start button is pressed, or a calculation processing start instruction is input via the GUI or an input device, the computation unit 60 determines that the user has given the start instruction, for example.

If it is determined that the start instruction has been performed (Yes in S200), the computation unit 60 acquires a plurality of frame images (S202).

Next, the computation unit 60 sets the tentative threshold thM of the binarization in counting processing (S204), and performs counting processing on each of the plurality of acquired frame images (S206). Next, the computation unit 60 generates the integrated image by integrating the plurality of binarized frame images (S208), calculates the mean and variance of the pixel values of the pixels of the integrated image (S210) to obtain the normalized constant S (S212).

Next, the computation unit 60 determines whether M=N is satisfied (S214), and if it is determined that M=N is not satisfied (No in S214), the computation unit 60 sets M=M+1 and returns to processing S204. The computation unit 60 repeats processing S204, S206, S208, S210, S212, and S214, with a different tentative threshold each time.

The computation unit 60 repeats the above processing N times, and if M=N is satisfied (Yes in S214), determines the optimal threshold based on the obtained N normalized constants S (S216).

Processing S202, S204, S206, S208, S210, S212, S214, and S216 are respectively performed similarly to processing S102, S104, S106, S108, S110, S112, S114, and S116 illustrated in the above FIG. 5.

Next, the computation unit 60 calculates the detective quantum efficiency (S218). First, the computation unit 60 binarizes each of the plurality of frame images acquired in processing S202, using the optimal threshold obtained in processing S216. Next, the computation unit 60 generates an integrated image by integrating the plurality of binarized frame images. Next, the computation unit 60 obtains the detective quantum efficiency based on the mean of the pixel values of the pixels of the integrated image and the number of the electrons that enter each cell of the image sensor 42.

Here, the number of electrons that enter each cell of the image sensor 42 is the number of electrons that enter each cell of the image sensor 42 in an exposure time (total exposure time) when the plurality of frame images are captured with the camera 40 in processing S202. The number of electrons that enter each cell of the image sensor 42 (e$^-$/pixel) can be obtained from the number of electrons that enter each cell of the image sensor 42 per unit time (e$^-$/pixel/sec) and the exposure time when the plurality of frame images are captured with the camera 40 in processing S202.

The computation unit 60 calculates the number of electrons (e$^-$/pixel/sec) that enter each cell of the image sensor 42 per unit time, based on the amperage of the electrons that enter the image sensor 42, that is measured with the measurement device 50. The computation unit 60 obtains the number of electrons (e$^-$/pixel) that enter each cell of the image sensor 42, based on the calculated number of electrons (e$^-$/pixel/sec) that enter each cell of the image sensor 42 per unit time and the exposure time.

The computation unit 60 calculates the mean of the pixel values of the pixels of the integrated image obtained by integrating the frame images that were binarized using the optimal threshold, and calculates the detective quantum efficiency by dividing the mean by the number (e⁻/pixel) of the electrons that enter each cell of the image sensor 42.

3. Effect

With the electron microscope 100, the computation unit 60 performs processing for setting the threshold. In the processing for setting the threshold, the computation unit 60 repeatedly performs processing including (i) setting a tentative threshold, (ii) acquiring a plurality of the frame images obtained on a condition that electrons that enter the image sensor 42 follow the Poisson process, (iii) binarizing each of the plurality of acquired frame images using the tentative threshold, (iv) generating an integrated image by integrating the plurality of binarized frame images, and (v) obtaining a normalized constant based on a mean and variance of pixel values of pixels of the integrated image, with a different tentative threshold each time, and the computation unit obtains an optimal threshold based on the plurality of obtained normalized constants and sets the optimal threshold as the threshold. As a result, with the electron microscope 100, the appropriate threshold can be set, and the linearity between the pixel values and the number of the incident electrons can be improved.

Also, with the electron microscope 100, since the computation unit 60 obtains the threshold of binarization in the counting processing, the threshold can be easily set. Accordingly, with the electron microscope 100, for example, if the image sensor 42 is degraded due to a radiation damage, the threshold corresponding to the degraded image sensor 42 can be easily set.

With the electron microscope 100, the computation unit 60 performs processing for binarizing each of the plurality of frame images using the optimal threshold, generating the integrated image by integrating the binarized frame images, and obtaining the detective quantum efficiency based on the mean of the pixel values of the pixels of the integrated image and the number of electrons that enter each cell of the image sensor 42. In this manner, with the electron microscope 100, the detective quantum efficiency can be obtained.

With the electron microscope 100, since the detective quantum efficiency can be obtained, for example, by obtaining the detective quantum efficiencies before and after the image sensor 42 is degraded due to a radiation damage, the degree of the drop in the detective quantum efficiency can be grasped.

4. Variation

4.1. First Variation

In the above embodiment, as the precondition, it is assumed that the electrons that entered one cell of the image sensor 42 do not enter other cells. However, the electrons that entered one cell may enter other adjacent cells.

In order for the input to the camera 40 and the output from the camera 40 to follow the Poisson process, even if the electrons that entered one cell entered other adjacent cells, the one cell where the electrons entered need be specified. At this time, the position of the cell need not be specified, and it is sufficient that the number of electrons that entered the image sensor 42 matches the number of electrons specified in the frame image.

Figure 7:
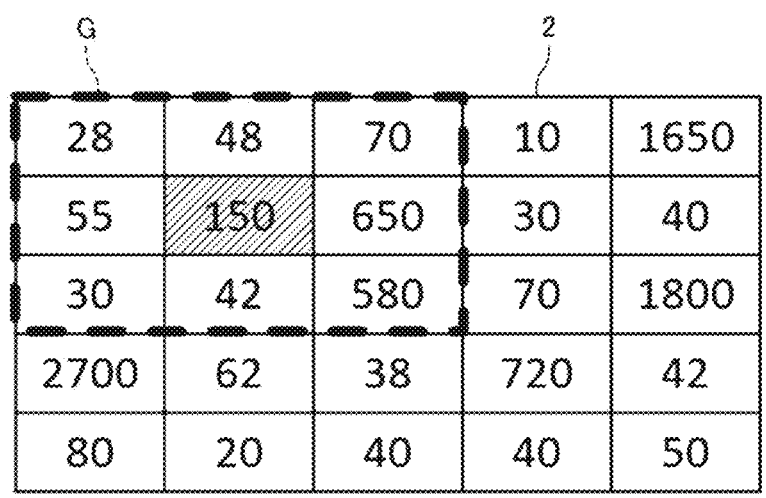
FIG. 7 is a diagram for explaining, when electrons that had entered one cell entered adjacent other cells, a method for specifying the one cell where the electrons had entered.

FIG. 7 is a diagram for explaining, when electrons that had entered one cell entered other cells, a method for specifying the one cell where the electrons had entered in a case where the electrons that entered the one cell entered other adjacent cells. For example, as illustrated in FIG. 7, one pixel of interest (the hatched pixel) and eight pixels adjacent to the one pixel in the frame image 2 are set (grouped) as one group G. Then, a position of the center of gravity of the pixel values is obtained, and the pixel that overlaps the position of the center of gravity is set to the pixel corresponding to the cell where the electrons entered.

Alternatively, for example, as illustrated in FIG. 7, one pixel of interest and eight pixels adjacent to the one pixel in the frame image 2 are set as one group G, and the pixel having the largest pixel value of the group G is set to the pixel corresponding to the cell where the electrons entered.

Alternatively, for example, as illustrated in FIG. 7, one pixel of interest and eight pixels adjacent to the one pixel in the frame image 2 are set as one group G, and the pixel located in a predetermined position of the group G is set to a pixel corresponding to the cell where the electrons entered. For example, the pixel located in the upper left end in the group G is set to the pixel corresponding to the cell where the electrons entered.

In the above description, one pixel of interest and eight pixels adjacent to the one pixel are set as one group G. However, the method of grouping for collecting the plurality of pixels into one group and the number of the pixels included in the group are not limited thereto.

As described above, the method for specifying the one cell where the electrons entered is not limited to these, and it is sufficient that one cell where the electrons entered can be specified such that the number of the electrons that entered the image sensor 42 matches the number of electrons specified in the frame image.

4.2. Second Variation

Figure 8:
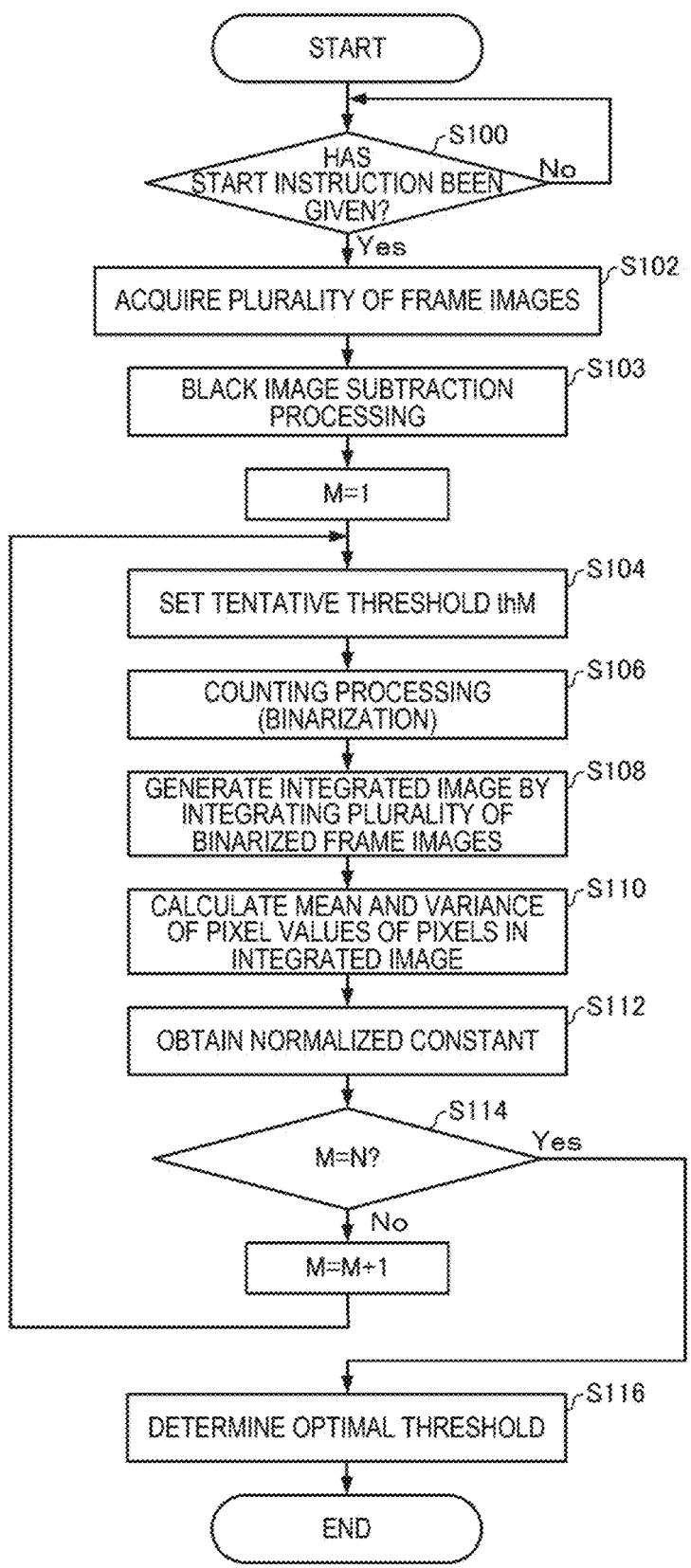
FIG. 8 is a flowchart illustrating a variation of processing for setting a threshold, performed by the computation unit.

FIG. 8 is a flowchart illustrating a variation of processing for setting the threshold of the computation unit 60.

As illustrated in FIG. 8, after processing S102 for acquiring the plurality of frame images, the computation unit 60 performs black image subtraction processing S103 on each of the plurality of frame images.

The black image subtraction processing is processing for subtracting black images from the frame images. Here, a black image is an image captured on the condition that no electron enters the image sensor 42. By performing the black image subtracting processing, regular noise of the image sensor 42 can be removed.

In the processing for calculating the detective quantum efficiency illustrated in FIG. 6 as well, the black image subtracting processing may be performed on each of the plurality of frame images after processing S202 for acquiring the plurality of frame images.

4.3. Third Variation

Figure 9:
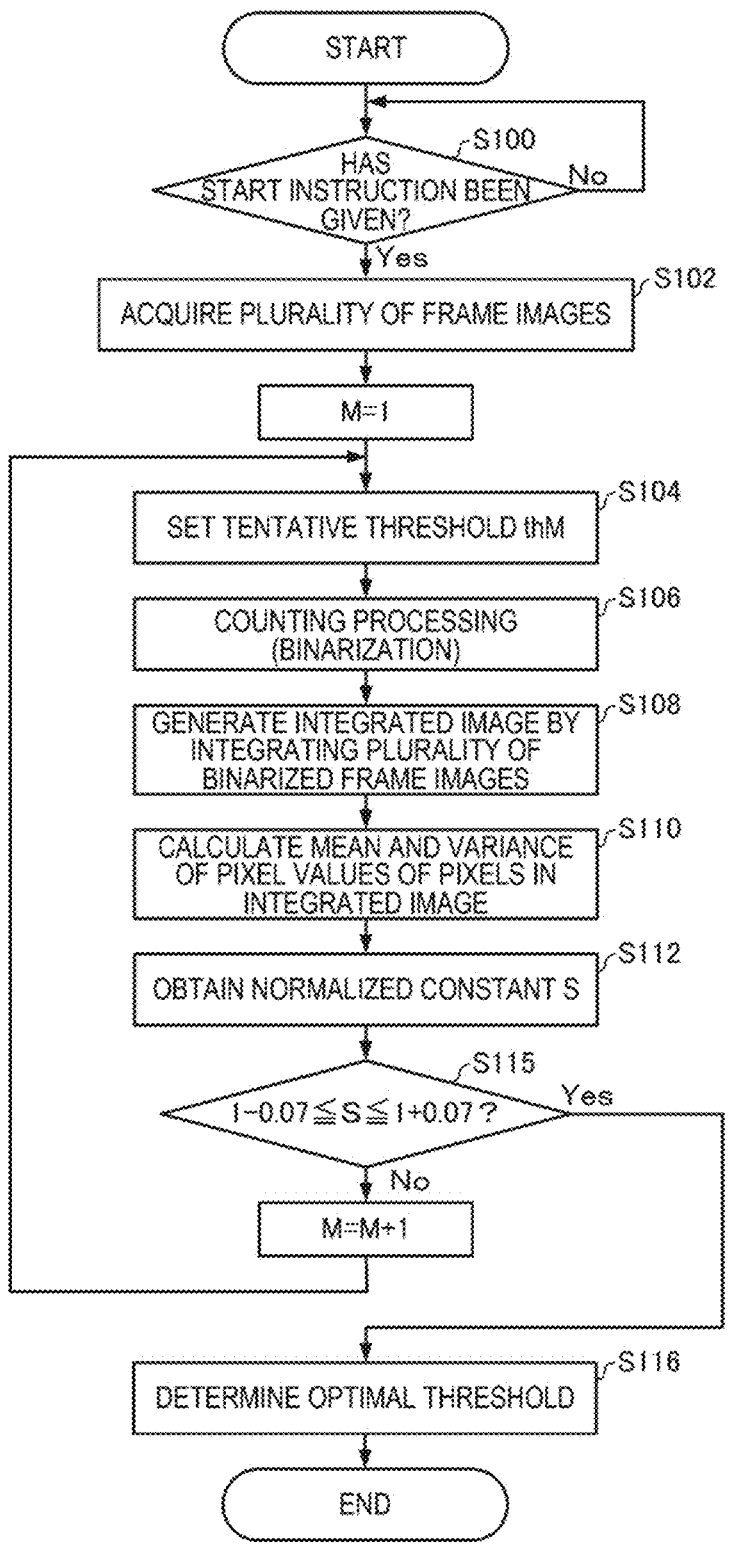
FIG. 9 is a flowchart illustrating a variation of processing for setting a threshold, performed by the computation unit.

FIG. 9 is a flowchart illustrating a variation of processing for setting the threshold performed by the computation unit 60.

In the example illustrated in the above FIG. 5, after obtaining the normalized constants S respectively corresponding to the tentative thresholds th1 to thN, the optimal threshold was determined out of the tentative thresholds th1 to thN.

In contrast, in a variation illustrated in FIG. 9, after processing S112 for obtaining the normalized constant S, the computation unit 60 determines whether the normalized constant S satisfies $1-0.07 \leq S \leq 1+0.07$ (S115).

If it is determined that the normalized constant S obtained in the processing S112 does not satisfy $1-0.07 \leq S \leq 1+0.07$ (No in S115), the computation unit 60 changes the threshold, returns to processing S104, and performs processing S106, S108, S110, S112, and S115.

If it is determined that the normalized constant S obtained in the processing S112 satisfies 1−0.07≤S≤1+0.07 (Yes in S115), the computation unit 60 sets the tentative threshold at this time to the optimal threshold (S116).

5. Example of Experiment

Figure 10:
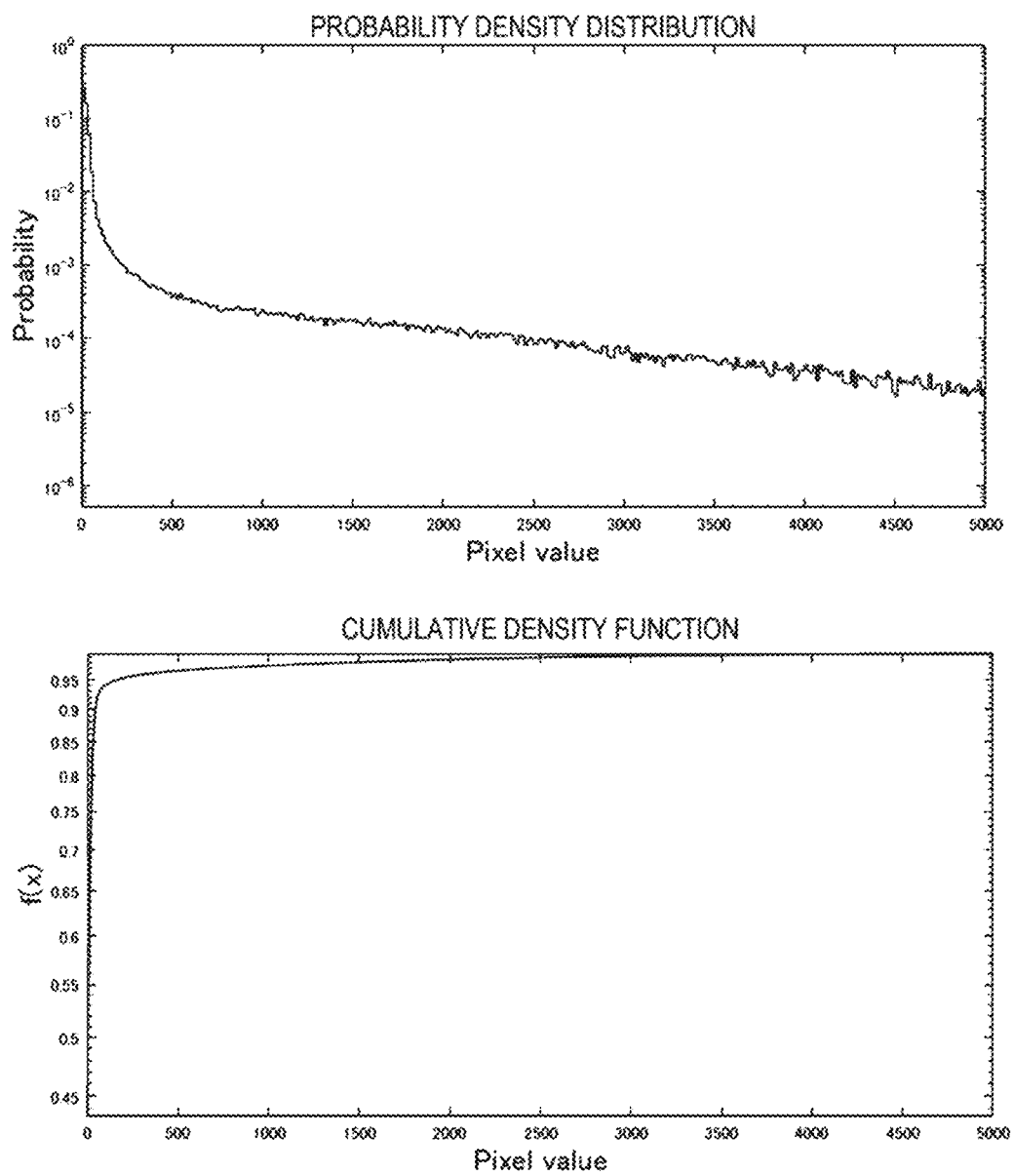
FIG. 10 is a diagram illustrating a probability density distribution and a cumulative density function that simulate signals (including noise) obtained from electrons that entered an image sensor.

FIG. 10 is a diagram illustrating the probability density distribution and the cumulative density function that simulate the signals (including noise) obtained from the electrons that entered the image sensor.

Ten frames of simulated images were generated through simulation based on the probability density distribution and cumulative density function illustrated in FIG. 10.

Figure 11:
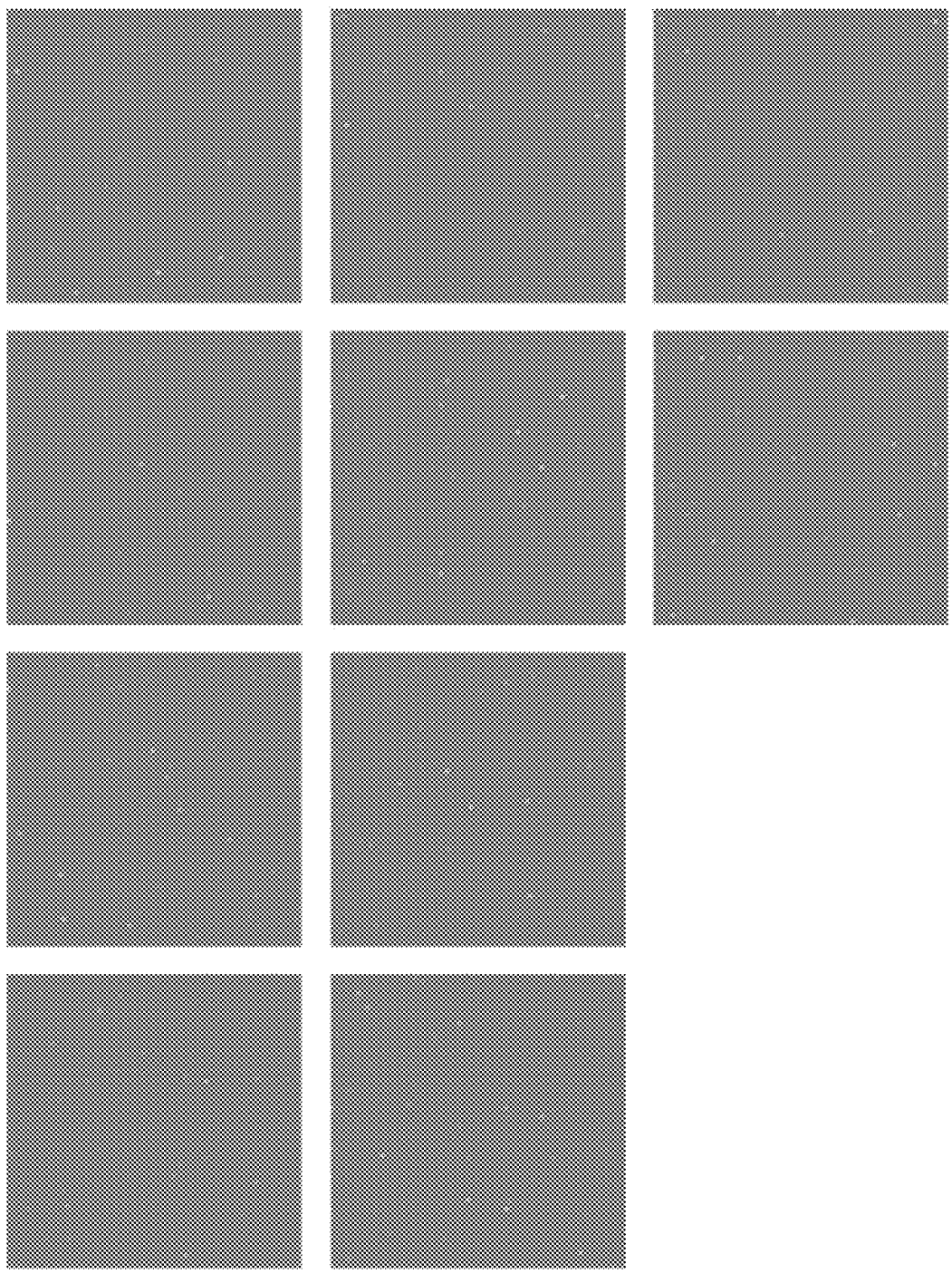
FIG. 11 is a diagram illustrating 10 frames of simulated images.

FIG. 11 is a drawing illustrating the ten frames of simulated images. In FIG. 11, for convenience, the simulated images are expressed in the gray scale.

The simulated images are obtained by simulating frame images obtained when the electrons entered the image sensor with the probability density distribution and cumulative density function as illustrated in FIG. 10. The size of the simulated images is 100 pixel×100 pixel.

The threshold of binarization was set, and counting processing (binarization) was performed on the 10 frames of simulated images illustrated in FIG. 11. Next, the binarized 10 frames of simulated images were integrated to generate a counting image (integrated image). Next, the mean and variance of the pixel values of the pixels in the counting image were calculated, and the calculated mean was divided by the calculated variance to obtain the normalized constant.

This processing was repeated while changing the threshold every 25, from 25 to 200, to obtain the normalized constant for each threshold.

Figure 12:
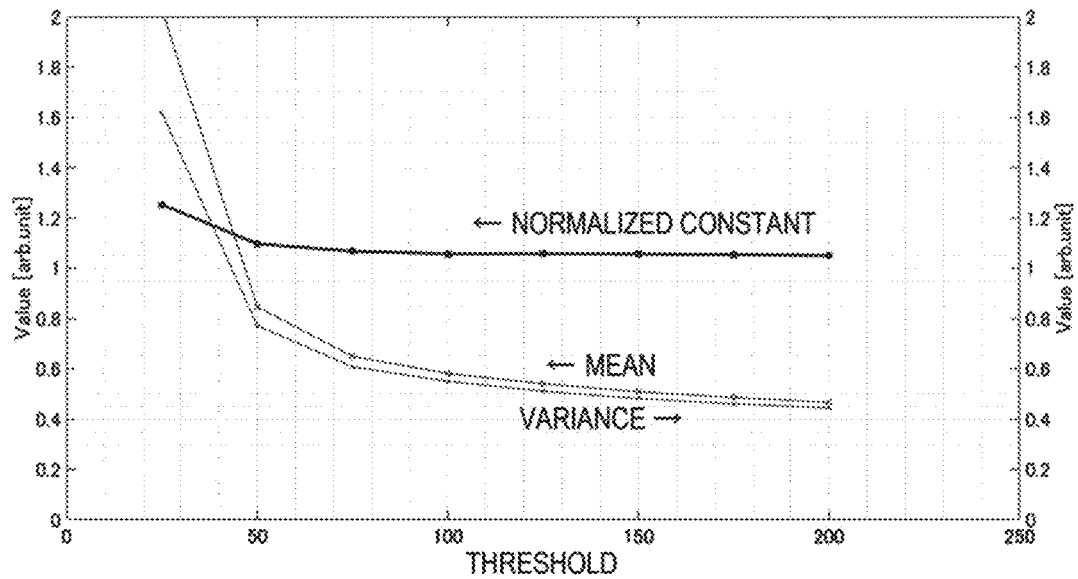
FIG. 12 is a graph indicating a relationship between threshold and normalized constant, a relationship between threshold and the mean of pixel values of pixels in a counting image, and a relationship between threshold and variance of pixel values of pixels in a counting image.

FIG. 12 is a graph illustrating a relationship between the threshold and normalized constant, the relationship between the threshold and mean of the pixel values of the pixels in the counting image, and the relationship between the threshold and variance of the pixel values of the pixels in the counting images. Note that the arrows illustrated in FIG. 12 indicate the corresponding axes.

When the threshold is 25, the mean and the variance are significantly diverged from each other. When the threshold is 50, the difference between the mean and the variance is smaller compared to the case where the threshold is 25. In the range where the threshold is 100 or more, the difference between the mean and the variance hardly changes.

As illustrated in FIG. 12, the minimum threshold included in the range where the normalized constant S satisfies 1−0.07≤S≤1+0.07 is 75. Accordingly, the optimal threshold is 75.

Here, as illustrated in FIG. 12, the threshold is in the range from 75 to 200, the normalized constant S is included in the range where 1−0.07≤S≤1+0.07, and follows the Poisson process. However, in the range where the threshold is from 75 to 200, the mean of the pixel values of the pixels in the counting image is the largest when the threshold is 75, and decreases the larger the threshold value is. This decrease in the threshold suggests that count loss of electrons has occurred. Accordingly, by selecting the minimum threshold included in the range where the normalized constant S satisfies 1−0.07≤S≤1+0.07 as the optimal threshold, counting loss of the electrons can be reduced.

Note that the above description illustrated the case where the step size of the threshold is but the step size of the threshold is not particularly limited. If the step size of the threshold is set smaller, the more suitable optimal threshold can be obtained.

Next, the detective quantum efficiency was obtained. Here, the detective quantum efficiency was obtained for each threshold on the assumption that the mean number of incident electrons per cell per frame was 0.1 e⁻/pixel/frame.

Figure 13:
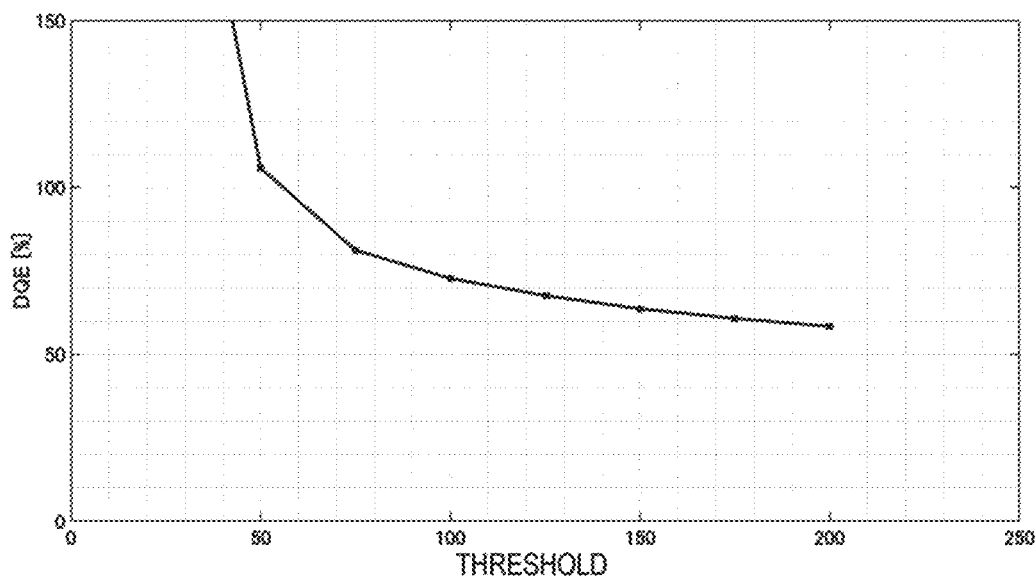
FIG. 13 is a graph illustrating a relationship between threshold and detective quantum efficiency.

FIG. 13 illustrates a graph illustrating a relationship between the threshold and the detective quantum efficiency.

As illustrated in FIG. 13, when the threshold is 50 or less, the detective quantum efficiency exceeds 100. From this fact, it can be confirmed that the Poisson process is not followed when the threshold is 50 or less. Also, it can be seen that the larger the threshold is, the smaller the detective quantum efficiency is.

Figure 14:
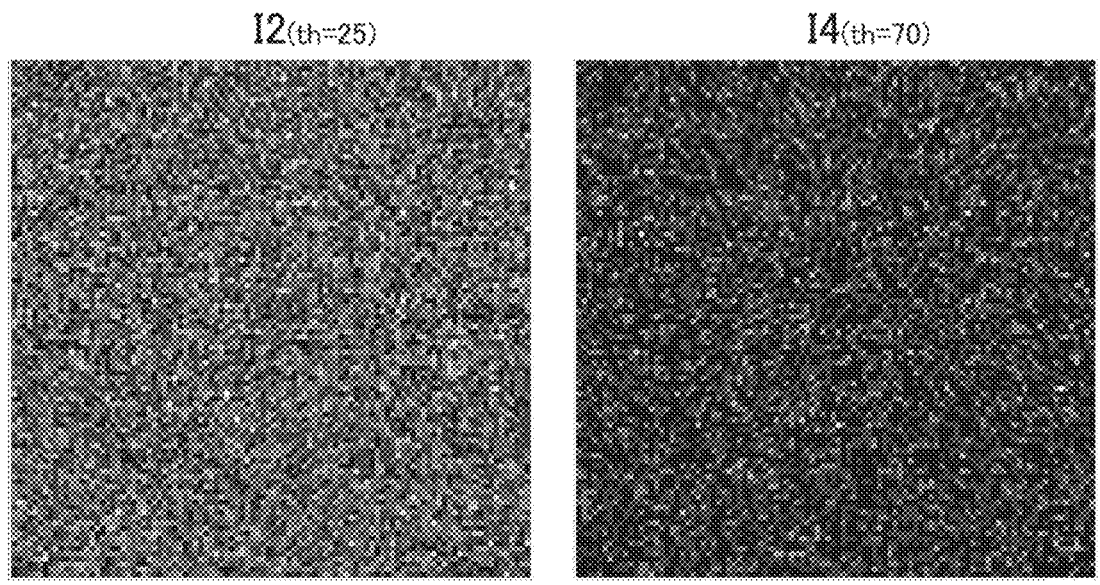
FIG. 14 illustrates a counting image that was subjected to counting processing with the threshold value set to 25 and a counting image that was subjected to counting processing with the threshold value set to 75.

FIG. 14 is a diagram illustrating a counting image 12 that was subjected to counting processing with the threshold set to 25 and a counting image 14 that was subjected to counting processing with the threshold set to 75, which is the optimal threshold.

As illustrated in FIG. 14, the counting image 12 includes more white pixels than the counting image 14. This is because, as illustrated in FIG. 13, when the threshold is 25, the detective quantum efficiency exceeds 100%, and thus noise is counted in the counting image 12.

The invention is not limited to the above-described embodiments, and various modifications can be made. For example, the invention includes configurations that are substantially the same as the configurations described in the embodiments. Substantially same configurations mean configurations having the same functions, methods and results, or configurations having the same objectives and effects as those of the configurations described in the embodiments, for example. The invention also includes configurations obtained by replacing non-essential elements of the configurations described in the embodiments with other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

What is claimed is:

1. An electron microscope comprising:
   an electronic optical system that irradiates a specimen with an electron beam and forms an image using electrons transmitted through the specimen;
   a camera that comprises an image sensor and outputs a frame image which is based on a signal obtained by electrons entering each cell of the image sensor; and
   a computation unit that generates an image based on the frame image,
   the computation unit performing processing for:
     setting a threshold; and
     binarizing the frame image using the threshold, and generating the image based on the binarized frame image, and
   in the processing for setting the threshold,
   the computation unit repeatedly performing processing for (i) setting a tentative threshold, (ii) acquiring a plurality of the frame images obtained on a condition that electrons entering the image sensor follow Poisson process, (iii) binarizing each of the plurality of acquired frame images using the tentative threshold, (iv) generating an integrated image by integrating the plurality of binarized frame images, and (v) obtaining a normalized constant based on a mean and variance of pixel values of pixels of the integrated image, with the tentative threshold being differed each time of the processing, and the computation unit obtaining an optimal threshold based on the plurality of obtained normalized constants and setting the optimal threshold as the threshold.

2. The electron microscope according to claim 1, further comprising a measurement device that measures an amperage of electrons that enter the image sensor, wherein the computation unit performs processing for:

binarizing each of the plurality of frame images using the optimal threshold;

generating an integrated image by integrating the plurality of binarized frame images; and obtaining a detective quantum efficiency based on a mean of pixel values of pixels of the integrated image and the number of electrons that enter each cell of the image sensor.

3. The electron microscope according to claim 1, wherein, in the processing for setting the threshold, the computation unit specifies a pixel corresponding to a cell where electrons entered, based on pixel values of a plurality of adjacent pixels in the frame image.

4. The electron microscope according to claim 1, wherein the camera directly detects electrons with the image sensor.

5. A calibration method for threshold calibration performed by an electron microscope, the electron microscope comprising:

an electronic optical system that irradiates a specimen with an electron beam and forms an image using electrons transmitted through the specimen;

a camera that comprises an image sensor and outputs a frame image which is based on a signal obtained by electrons entering each cell of the image sensor; and a computation unit that generates an image based on the frame image, the computation unit performing processing for binarizing the frame image using a threshold, and generating the image based on the binarized frame image, the calibration method comprising:

repeatedly performing processing for (i) setting a tentative threshold, (ii) acquiring a plurality of the frame images obtained on a condition that electrons entering the image sensor follow Poisson process, (iii) binarizing each of the plurality of acquired frame images using the tentative threshold, (iv) generating an integrated image by integrating the plurality of binarized frame images, and (v) obtaining a normalized constant based on a mean and variance of pixel values of pixels of the integrated image, with the tentative threshold being differed each time of the processing;

obtaining an optimal threshold based on the plurality of obtained normalized constants; and setting the optimal threshold as the threshold.

* * * * *